United States Patent
Seo et al.

(10) Patent No.: US 11,999,756 B2
(45) Date of Patent: Jun. 4, 2024

(54) METHOD FOR PRODUCING ORGANOMETALLIC COMPOUND AND THIN FILM FABRICATED USING ORGANOMETALLIC COMPOUND OBTAINED THEREBY

(71) Applicants: HANSOL CHEMICAL CO., LTD., Seoul (KR); Industry-Academic Cooperation Foundation, Yonsei University, Seoul (KR)

(72) Inventors: Jin-Hyung Seo, Jeollabuk-do (KR); Mi-Ra Park, Jeollabuk-do (KR); Jang-Hyeon Seok, Sejong-si (KR); Jung-Woo Park, Seoul (KR); Hyung-Jun Kim, Seoul (KR); Tae-Wook Nam, Seoul (KR); Yu-Jin Lee, Seoul (KR)

(73) Assignees: HANSOL CHEMICAL CO., LTD., Seoul (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 17/722,654

(22) Filed: Apr. 18, 2022

(65) Prior Publication Data
US 2022/0356198 A1 Nov. 10, 2022

(30) Foreign Application Priority Data
Apr. 22, 2021 (KR) .................. 10-2021-0052409

(51) Int. Cl.
*C07F 11/00* (2006.01)
*C07F 17/00* (2006.01)
*C23C 30/00* (2006.01)

(52) U.S. Cl.
CPC .............. *C07F 17/00* (2013.01); *C23C 30/00* (2013.01)

(58) Field of Classification Search
CPC .................................................... C07F 11/00
See application file for complete search history.

(56) References Cited

U.S. PATENT DOCUMENTS

2008/0081127 A1  4/2008  Thompson et al.

FOREIGN PATENT DOCUMENTS

| CN | 101516900 A | 8/2009 |
| CN | 104213096 A | 12/2014 |
| JP | 2001-002723 A | 1/2001 |
| JP | 2010-504999 A | 4/2008 |
| KR | 10-1434696 B | 8/2014 |

OTHER PUBLICATIONS

Baker, Murray V., et al. "Comparative investigation of the Group 6 (Cr, Mo or W) metal carbonyl complexes of 1,3,5-triazacyclohexanes." J. Chem. Soc., Dalton Trans. (1998), pp. 1145-1149. (Year: 1998).*
Baker, Murray V. et al., 1,3,5-Trimethyl-1,3,5-triazacyclohexane tricarbonyl complexes of Mo and W as sources of the fac-M(CO)3 fragment. Mild syntheses of fac-[M(CO)3(CH3CN)3] (M=Mo, W), [W(CO)3(PR3)3], [W(CO)(alkyne)3] and [W(CO)3(π-arene)] complexes, Journal of Organometallic Chemistry,1998年, 565(1-2), pp. 225-230.
Armanasco, Nicole L. et al., Comparative investigation of the Group 6 (Cr, Mo or W) metal carbonyl complexes of 1,3,5-triazacyclohexanes, Journal of the Chemical Society, Dalton Transactions: Inorganic Chemistry, 1998年, (7), pp. 1145-1150.
Armanasco, Nicole L. et al., Tricarbonyl 1,3,5-trimethyl-1,3,5-triazacyclohexane complexes of chromium(0), molybdenum(0), and tungsten(0) [M(CO)3(Me3TACH)] (M=Cr, Mo, W)], Inorganic Syntheses, 2010年, 35, pp. 109-114.
Armanasco, Nicole L. et al., Chromium(0) tricarbonyl complexes of 1,3,5-triazacyclohexanes, Journal of the Chemical Society, Dalton Transactions: Inorganic Chemistry, 1997年, (8), pp. 1363-1368.
Luttringhaus, Arthur et al., Mixed carbonyl complexes of chromium and molybdenum with organo nitrogen compounds, Tetrahedron Letters, 1959 年, No. 10, pp. 13-15.
Kuramshin, A. I. et al., Preparation of Complexes η4-4-(1,3-Diphenyl-2-propen-1-one)-η3-3-(1,3,5-triorganyl-1,3,5-triazacyclohexane)carbonyltungsten(0) and Their Reactions with Diethyl Phosphite, Russian Journal of Organic Chemistry, 2005 年,41(5), pp. 779-783.
Chi, Yun et al., Synthesis of the First Cluster Complexes Bearing Three Quadruply Bridging CO Ligands: X-ray Crystal Structure of [C5H3(SiMe3)2]WRu6(μ3-H)(CO)18, Journal of the American Chemical Society, 1997 年, 119(45), pp. 11114-11115, Supporting Information p. 3.
Solution Calorimetric, Equilibrium, and Synthetic Studies of Oxidative Addition Reductive Elimination of C5R5H (R=H, Me, Indenyl) to/from the Complexes M(CO), (RCN),/(q5-C,R,)M(CO), H (M=Cr, Mo, W) , Gregory J. Kubas et al., Organometallics, vol. 10, p. 2870-2876, Dec. 31, 1991.

* cited by examiner

*Primary Examiner* — John S Kenyon
(74) *Attorney, Agent, or Firm* — Brooks, Cameron & Huebsch, PLLC

(57) ABSTRACT

The present invention relates to a method for producing a high yield of an organometallic compound including a step of allowing a metal hexacarbonyl compound to react with a hexahydro-1,3,5-triazine compound, and a thin film having excellent properties, fabricated by depositing the produced organometallic compound.

5 Claims, 6 Drawing Sheets

(a)

(b)

METHOD FOR PRODUCING ORGANOMETALLIC COMPOUND AND THIN FILM FABRICATED USING ORGANOMETALLIC COMPOUND OBTAINED THEREBY

CROSS-REFERENCE TO RELATED APPLICATION

This application claims priority to Korean Patent Application No. 10-2021-0052409, filed on Apr. 22, 2021, the disclosure of which is incorporated herein by reference in its entirety.

BACKGROUND OF THE INVENTION

Field of the Invention

The present invention relates to a method for producing an organometallic compound that may be used as a vapor deposition compound that may be deposited as a thin film by vapor deposition, and a thin film fabricated using the produced organometallic compound, and specifically, to a method for producing an organometallic compound, which may produce an organometallic compound in a significantly improved yield, and a thin film fabricated using the produced organometallic compound and having excellent properties.

Description of the Related Art

In recent years, as the degree of integration of semiconductor devices has increased rapidly, there has been a need for a technology which is capable of depositing a uniform metal thin film with a high aspect ratio in a semiconductor wiring process and capable of stacking a metal thin film having a uniform thickness irrespective of the structure in a multilayer wiring process. For fabrication of such metal thin films, improvements in deposition process technology and precursor compounds have been required.

To this end, in terms of the development of deposition process technology, the application of atomic layer deposition (ALD) is rapidly expanding.

Atomic layer deposition is based on a self-limiting reaction that occurs on the surface, can form a thin film by deposition in atomic layer units, and can deposit a thin film having a uniform thickness over a large area and complex three-dimensional structure due to its excellent step coverage.

With expansion of the application of atomic layer deposition, there has been an increased need for various organometallic compounds (e.g., chromium (Cr), molybdenum (Mo), vanadium (V), niobium (Nb), and tungsten (W) compounds, etc.) that may be optimally used as precursors for atomic layer deposition.

For example, tungsten is advantageous for a high-temperature process due to its high melting point and low resistance, and may be applied to electrodes and wiring materials for semiconductors due to its advantage in term to current transfer easiness.

As conventional tungsten precursors for forming electrodes and wiring materials for semiconductors, halogen-based precursors such as tungsten fluoride and tungsten chloride have been mainly used.

These precursors have the advantages of having a simple structure, being in gas or solid state at room temperature, being able to provide a relatively pure metal, and having high thermal stability, but have disadvantages in that trace amounts of fluorine, chlorine, etc. remaining in the thin films obtained using these precursors may cause corrosion of the underlying substrate, resulting in degradation of the characteristics of electronic devices, and by-products such as HF and HCl generated during the process have very strong toxicity.

In particular, in order to overcome the problem caused by fluorine, chlorine, etc. remaining in the thin films, it is necessary to add a barrier layer. However, in this case, a problem arises in that specific resistance increases.

In order to overcome these problems, novel halogen-free tungsten precursors (for example, tungsten precursors containing a cyclopentadienyl group), which have high thermal stability and are capable of reducing impurities in thin films, have been developed, but have the disadvantages of having a low reaction yield and being expensive.

Therefore, there is a need for a production method capable of synthesizing a novel tungsten precursor in high reaction yield.

In addition, there is a need for improving the efficiency of a method of fabricating a thin film using this novel tungsten precursor and for improving the properties of the fabricated thin film.

[Prior Art Documents]
[Patent Documents]
(Patent Document 1) Korean Patent No. 10-1434696

SUMMARY OF THE INVENTION

Therefore, an object of the present invention is to provide a method for producing an organometallic compound, a method of fabricating a thin film using the organometallic compound, and a thin film fabricated thereby.

In particular, the method for producing an organometallic compound is capable of producing an organometallic compound in significantly improved yield, and a thin film fabricated using the produced organometallic compound may have excellent properties and may be used in various electronic devices.

However, objects to be achieved by the present invention are not limited to the above-mentioned object, and other objects not mentioned herein will be clearly understood by those skilled in the art from the following description.

One aspect of the present invention provides a method for producing an organometallic compound, the method including a first step of synthesizing a compound of the following Formula 2 by allowing a metal hexacarbonyl compound to react with a compound of the following Formula 1:

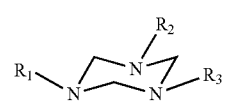

[Formula 1]

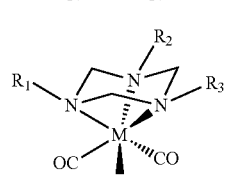

[Formula 2]

wherein $R_1$ to $R_3$ are each independently hydrogen or a linear or branched hydrocarbon having 1 to 4 carbon atoms, and M is any one selected from the group consisting of chromium (Cr), molybdenum (Mo), vanadium (V), niobium (Nb) and tungsten (W).

The method for producing an organometallic compound may include a second step of synthesizing a compound of the following Formula 4 by allowing the compound of Formula 2 to react with a compound of the following Formula 3:

$$R_4—C≡N \quad \text{[Formula 3]}$$

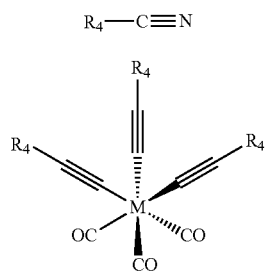

[Formula 4]

wherein $R_4$ is hydrogen or a linear or branched hydrocarbon having 1 to 3 carbon atoms, and M is any one selected from the group consisting of chromium (Cr), molybdenum (Mo), vanadium (V), niobium (Nb) and tungsten (W).

The method for producing an organometallic compound may include a third step of synthesizing a compound of the following Formula 6 by allowing the compound of Formula 4 to react with a cyclopentadienyl compound of the following Formula 5:

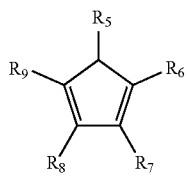

[Formula 5]

wherein $R_5$ to $R_9$ are each independently hydrogen or a linear or branched hydrocarbon having 1 to 4 carbon atoms;

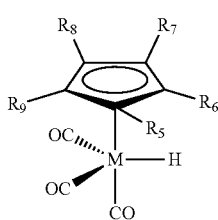

[Formula 6]

wherein M is any one selected from the group consisting of chromium (Cr), molybdenum (Mo), vanadium (V), niobium (Nb) and tungsten (W), and $R_5$ to $R_9$ are each independently hydrogen or a linear or branched hydrocarbon having 1 to 4 carbon atoms.

In the method for producing an organometallic compound, the organometallic compound may be a compound of the following Formula 7 or 8:

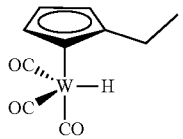

[Formula 7]

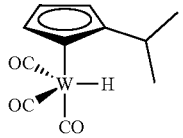

[Formula 8]

Another aspect of the present invention provides a method for fabricating a thin film, the method including steps of: (1) feeding and depositing a vapor deposition precursor, which includes the organometallic compound produced by the above-described method, onto a substrate, and purging an unreacted portion of the vapor deposition precursor with inert gas; and (2) feeding and allowing a reactant gas to react with the deposited vapor deposition precursor and purging an unreacted portion of the reactant gas, wherein the reactant gas is activated by plasma, the feeding time of the vapor deposition precursor in step (1) is 4 seconds or more, and the feeding time of the reactant gas in step (2) is 8 seconds or more.

In the method for fabricating a thin film, the reactant gas may be any one or more selected from the group consisting of an oxidizing agent, a reducing agent, and a nitriding agent.

In the method for fabricating a thin film, the thin film may be deposited at a temperature of 350° C. or below and a growth rate of 0.21 Å/cycle or less.

Still another aspect of the present invention provides a tungsten metal thin film having a density of 14 $g/cm^3$ or higher.

The tungsten metal thin film may include an α-phase and a β-phase.

The tungsten metal thin film may have a specific resistance value of 300 μΩ·cm or less.

Effects of the present invention are as follows.

The method for producing an organometallic compound according to the present invention produces an organometallic compound in significantly improved yield.

In addition, the tungsten metal thin film fabricated by the method of fabricating a metal thin film using the organometallic compound produced by the method for producing an organometallic compound according to the present invention has excellent physical properties, particularly electrical properties.

The tungsten metal thin film having excellent properties, fabricated by the method of fabricating a metal thin film according to the present invention, may be used in various electronic devices, particularly semiconductor devices, displays, solar cells, and the like.

DESCRIPTION OF SPECIFIC EMBODIMENTS

Figure 1:
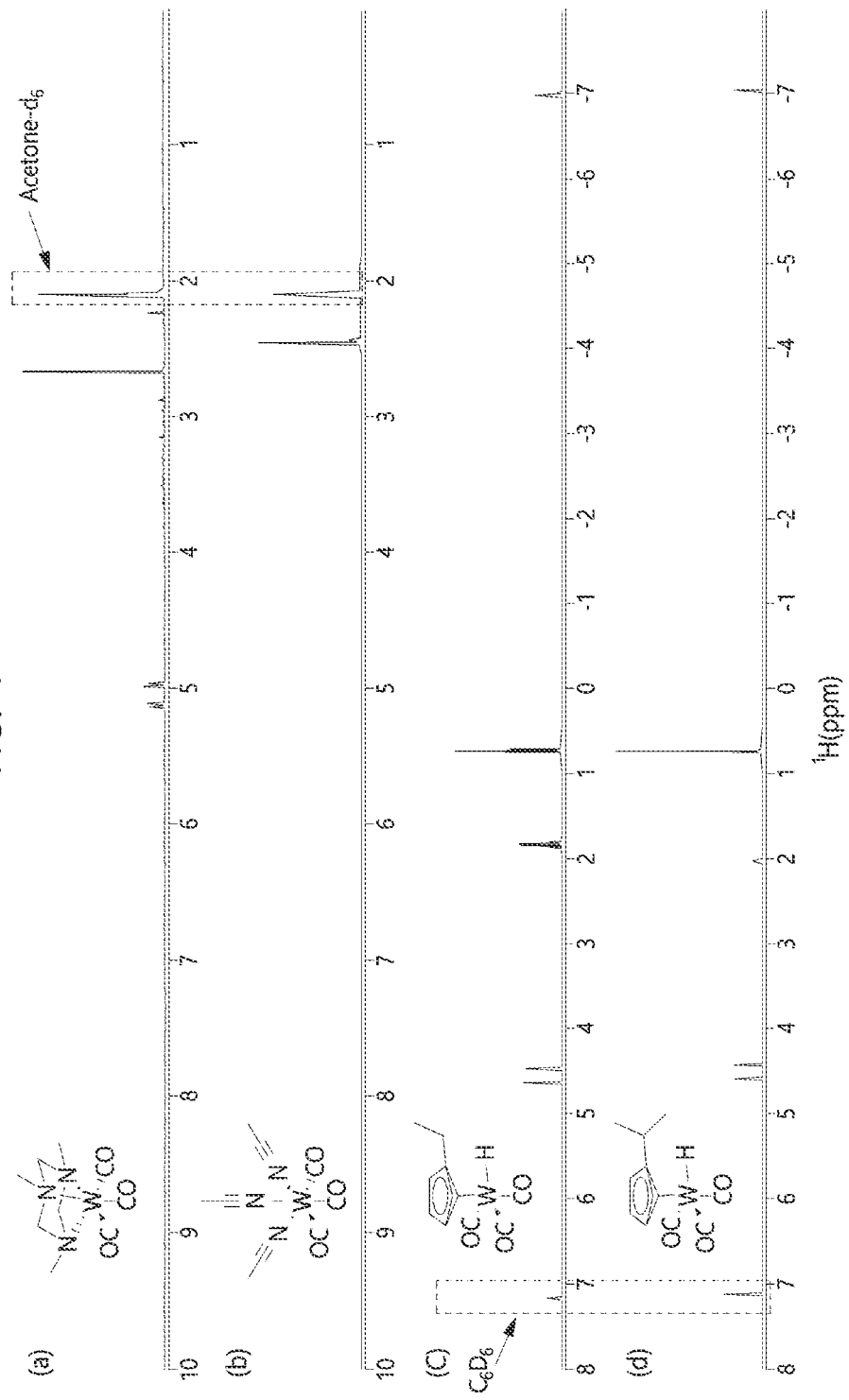
FIG. 1 shows the results of nuclear magnetic resonance (NMR) analysis of compounds produced in Examples 1 to 3.

Hereinafter, embodiments and examples of the present invention will be described in detail with reference to the accompanying drawings so that the present invention can be easily carried out by those of ordinary skill in the art to which the present invention pertains. However, the present application may be embodied in various different forms and is not limited to the embodiments and examples disclosed herein and the accompanying drawings. In addition, in order to clearly explain the present invention, parts irrelevant to the description are omitted from the drawings.

A method for producing an organometallic compound according to one aspect of the present invention may include a first step of synthesizing a compound of the following Formula 2 by allowing a metal hexacarbonyl compound to react with a compound (hexahydro-1,3,5-triazine) of the following Formula 1:

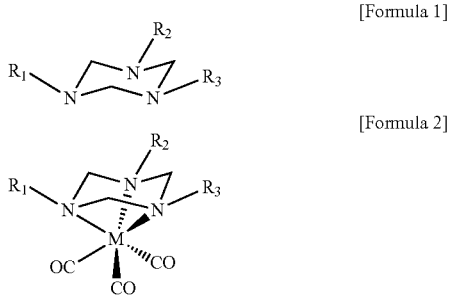

[Formula 1]

[Formula 2]

wherein $R_1$ to $R_3$ are each independently hydrogen or a linear or branched hydrocarbon having 1 to 4 carbon atoms, and M is any one selected from the group consisting of chromium (Cr), molybdenum (Mo), vanadium (V), niobium (Nb) and tungsten (W).

As the metal of the metal hexacarbonyl compound, any metal may be used as long as the metal is capable of forming a hexacarbonyl compound. Preferably, the metal of the metal hexacarbonyl compound may be any one selected from the group consisting of chromium (Cr), molybdenum (Mo), vanadium (V), niobium (Nb) and tungsten (W), and may more preferably be tungsten (W).

$R_1$ to $R_3$ in the compound of Formula 1 may preferably be methyl.

The compound of Formula 2 which is synthesized through the first step may be obtained in a yield of at least 80%, preferably at least 85%, more preferably at least 90%.

In the first step, toluene may be used as a solvent, and the reaction may be performed under reflux at a temperature of 110 to 120° C.

In one embodiment, the method for producing an organometallic compound may include a second step of synthesizing a compound of the following Formula 4 by allowing the compound of Formula 2, which is the reaction product of the first step, to react with a compound (nitrile) of the following Formula 3:

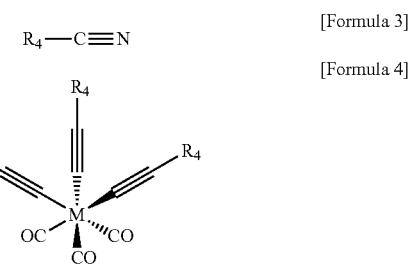

[Formula 3]

[Formula 4]

wherein $R_4$ is hydrogen or a linear or branched hydrocarbon having 1 to 3 carbon atoms, and M is any one selected from the group consisting of chromium (Cr), molybdenum (Mo), vanadium (V), niobium (Nb) and tungsten (W).

$R_4$ in Formula 3 may preferably be methyl or propyl.

The compound of Formula 4 which is synthesized through the second step may be obtained in a yield of at least 75%, preferably at least 80%, more preferably at least 85%.

In particular, if the compound of Formula 3 is allowed to react directly with the metal hexacarbonyl compound without using the compound of Formula 2 synthesized through the reaction of the first step, the selectivity may be greatly lowered, and thus the yield of the compound of Formula 4 may greatly decrease, and the yield of the final organometallic compound may also be very low.

In the second step, toluene may be used as a solvent, and the reaction may be performed at room temperature.

In one embodiment, the method for producing an organometallic compound may include a third step of synthesizing a compound of the following Formula 6 by allowing the compound of Formula 4, which is the reaction product of the second step, to react with a cyclopentadienyl compound of the following Formula 5:

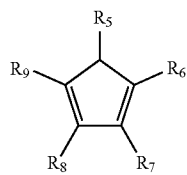

[Formula 5]

wherein $R_5$ to $R_9$ are each independently hydrogen or a linear or branched hydrocarbon having 1 to 4 carbon atoms:

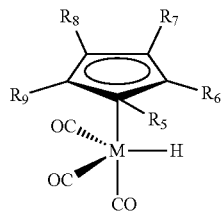

[Formula 6]

wherein M is any one selected from the group consisting of chromium (Cr), molybdenum (Mo), vanadium (V), niobium (Nb) and tungsten (W), and $R_5$ to $R_9$ are each independently hydrogen or a linear or branched hydrocarbon having 1 to 4 carbon atoms.

Preferably, at least one of $R_5$ to $R_9$ may be a linear or branched hydrocarbon having 1 to 4 carbon atoms.

In the third step, as the compound of Formula 4 is substituted with the cyclopentadienyl group, the oxidation number of the central metal is changed from 0 to +2.

The compound of Formula 6 which is synthesized through the third step may be obtained in a yield of at least 80%, preferably at least 85%, more preferably at least 90%.

In the third step, tetrahydrofuran (THF) may be used as a solvent, and the reaction may be performed under reflux at a temperature of 66 to 75° C.

In one embodiment, the organometallic compound may be a compound of the following Formula 7 or Formula 8.

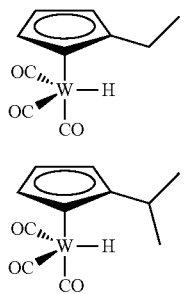

[Formula 7]

[Formula 8]

The organometallic compounds of Formulas 7 and 8 may overcome disadvantages (e.g., an increase in the content of halogen impurities in a thin film, etc.) which occur when a halogen-based organometallic compound is used as a vapor deposition precursor.

A method for fabricating a thin film according to another aspect of the present invention includes steps of: (1) feeding and depositing a vapor deposition precursor, which includes the organometallic compound produced by the above-described method, onto a substrate, and purging an unreacted portion of the vapor deposition precursor with inert gas; and (2) feeding and allowing a reactant gas to react with the deposited vapor deposition precursor and purging an unreacted portion of the reactant gas, wherein the reactant gas is activated by plasma, the feeding time of the vapor deposition precursor in step (1) is 4 seconds or more, and the feeding time of the reactant gas in step (2) is 8 seconds or more.

The deposition of the vapor deposition precursor including the organometallic compound may be performed using either atomic layer deposition (ALD), which can deposit a nanometer-thick thin film having excellent uniformity even on a three-dimensional structure having a complex shape, or metal-organic chemical vapor deposition (MOCVD) in which raw materials is all supplied in a gaseous state so that the amounts of the raw materials are relatively easily and accurately adjusted.

Step (1) and the subsequent step (2) may constitute one cycle, and the cycle may be repeated until a thin film having a desired thickness is obtained.

In addition, as the gas for purging, one or more inert gases selected from among argon (Ar), nitrogen ($N_2$), helium (He) and hydrogen ($H_2$) may be used, but the gas for purging is limited thereto.

As the reactant gas, an oxidizing agent, a reducing agent or a nitriding agent may be used depending on the thin film to be fabricated, but the reactant gas is not limited thereto.

For example, as the oxidizing agent, water vapor ($H_2O$), oxygen ($O_2$) or ozone ($O_3$) may be used, and as the reducing agent, hydrogen ($H_2$), ammonia ($NH_3$), hydrazine ($N_2H_4$), borane ($BH_3$), diborane ($B_2H_6$) or the like mat be used. As the nitriding agent, ammonia ($NH_3$), hydrazine ($N_2H_4$), nitrogen ($N_2$) or the like may be used.

The plasma for activating the reactant gas may be a mixed plasma of Ar and $H_2$. Through the use of the plasma, it is possible to widen the process temperature range by improving the reactivity of the reactant gas and to form a thin film having less impurities by inducing a complete reaction of the vapor deposition precursor.

The feeding time of the vapor deposition precursor in step (1) may be 4 seconds or more.

This is because, if the feeding time of the vapor deposition precursor is less than 4 seconds, the growth rate of the thin film will not be saturated.

The feeding time of the reactant gas in step (2) may be 8 seconds or more.

This is because, when the injection time of the reaction gas is less than 8 seconds, the growth rate of the thin film will not be saturated.

In one embodiment, a reducing agent may be used as the reactant gas.

In one embodiment, the deposition temperature of the method for manufacturing the thin film may be 350° C. or less, and the deposition rate may be 0.21 Å/cycle or less.

Preferably, the thin film may be deposited at a temperature of 200 to 300° C. That is, it is possible to fabricate the metal thin film at a relatively lower temperature than a high temperature of 500° C. or more, which is a conventional deposition temperature for fabricating a metal thin film.

A tungsten metal thin film according to still another aspect of the present invention may have a density of 14 g/cm³ or higher. This density is higher than the density (10 to 13 g/cm³) of a tungsten metal thin film consisting only of a β-phase.

In one embodiment, the tungsten metal thin film may include an α-phase and a β-phase. In addition, it is possible to obtain a thin film consisting only of a tungsten metal phase having a relatively high purity. In contrast, when a tungsten thin film is formed by depositing a conventional tungsten vapor deposition precursor, a thin film such as WCx, WOx or WNx is formed, which is difficult to apply to products that require a tungsten thin film consisting only of a high-purity metal phase.

In one embodiment, the tungsten metal thin film may have a specific resistance value of 300 μΩ·cm or less, and thus may be applied to various electronic products. In contrast, when a tungsten thin film is formed by depositing a conventional tungsten vapor deposition precursor, a tungsten thin film consisting of a high-purity metal phase as described above cannot be obtained, and thus the resulting thin film has a relatively high specific resistance value and the application range thereof is limited.

An electronic device according to yet another aspect of the present invention may include the thin film.

In an embodiment, the electronic device may be any one selected from the group consisting of a semiconductor device, a display, and a solar cell.

In particular, the tungsten thin film consisting of a pure metal phase may be applied as electrodes and wiring materials for semiconductors on the basis of its excellent resistance properties. For example, it may be applied to a gate for 3D NAND.

Hereinafter, the present invention will be described in more detail with reference to examples, but the scope of the present invention is not limited to these examples.

[Example 1] Synthesis of W(CO)$_3$(Me$_3$tach)

50 g (0.14 mol) of tungsten hexacarbonyl was metered into a 500 mL two-necked flask, and then 200 mL of toluene was added thereto. Next, 39.82 g (0.32 mol) of 1,3,5-trimethylhexahydro-1,3,5-triazine (Me$_3$tach) was added to the solution. Then, the mixture was stirred under reflux 16 hours.

After completion of the reaction, the formed yellow solid was filtered through a filter while keeping it hot, and the filtered solid was washed with toluene and hexane. Then, the washed solid was dried under vacuum to obtain a yellow solid (reaction yield: 90%).

The results of NMR measurement of the obtained W(CO)$_3$ (Me$_3$tach) are as follows and are shown in FIG. 1a.

$^1$H-NMR (400 MHz, acetone-D6): δ 5.07 (d, 3H), δ 4.93 (d, 3H), δ 2.62 (s, 9H).

[Example 2] Synthesis of W(CO)$_3$(CH$_3$CN)$_3$ 50 g (0.13 mol) of W(CO)$_3$(Me$_3$tach)$_3$ synthesized in Example 1 was metered into a 1-L two-necked flask, and then 200 mL of toluene and 400 mL of acetonitrile (CH$_3$CN) were sequentially added thereto.

Then, the mixture was stirred at room temperature for about 16 hours. After completion of the reaction, the formed pale yellow solid was filtered through a filter and washed with hexane. Then, the washed solid was dried under vacuum to obtain a pale yellow solid (yield: 85%).

The results of NMR measurement of the obtained W(CO)$_3$ (CH$_3$CN)$_3$ are as follows and are shown in FIG. 1b.

$^1$H-NMR (400 MHz, acetone-D6): δ 2.45 (s, 3H).

[Example 3] Synthesis of H(Cp)W(CO)$_3$

W(CO)$_3$(CH$_3$CN)$_3$ synthesized in Example 2 was metered into a 500-mL two-necked flask, and then 200 mL of tetrahydrofuran (THF) was added thereto. Next, ethyl cyclopentadiene or isopropyl cyclopentadiene was added to the solution.

Then, the mixture was stirred under reflux for about 16 hours. After completion of the reaction, the solvent and the volatile by-product were removed under vacuum. The residue was diluted in hexane and filtered through a celite filter, and the filtrate was dried under vacuum.

The resulting liquid was distilled under reduced pressure.

As a result, when the ethyl cyclopentadiene was used as the reactant, HEtCpW(CO)$_3$ was obtained as a yellow liquid (92% yield).

The results of NMR measurement of the obtained HEtCpW(CO)$_3$ are as follows and are shown in FIG. 1c.

$^1$H-NMR (400 MHz, C$_6$D$_6$): δ 4.63 (m, 2H), δ 4.46 (m, 2H), β 1.82 (q, 2H), δ 0.72 (t, 3H), δ −6.99 (s, 1H).

Meanwhile, when the isopropyl cyclopentadiene was used as the reactant, Hi-PrCpW(CO)$_3$ was obtained as a yellow liquid (60% yield).

The results of NMR measurement of the obtained Hi-PrCpW(CO)$_3$ are as follows and are shown in FIG. 1d.

$^1$H-NMR (400 MHz, C6D6): δ 4.59 (in, 2H), δ 4.42 (m, 2H), δ 2.02 (m, 1H), δ 0.73 (d, 6H), δ −7.05 (s, 1H).

Thermogravimetric analysis of the synthesized HEtCpW(CO)$_3$ and Hi-PrCpW(CO)$_3$ was performed. The instrument used for thermogravimetric analysis was a TGA/DSC 1 STAR system (Mettler Toledo), and an alumina crucible with a capacity of 50 μL was used. Each sample was used in an amount of 10 mg, and measurement was performed in the temperature range from 30° C. to 400° C. at a heating rate of 10° C./min.

Figure 2:
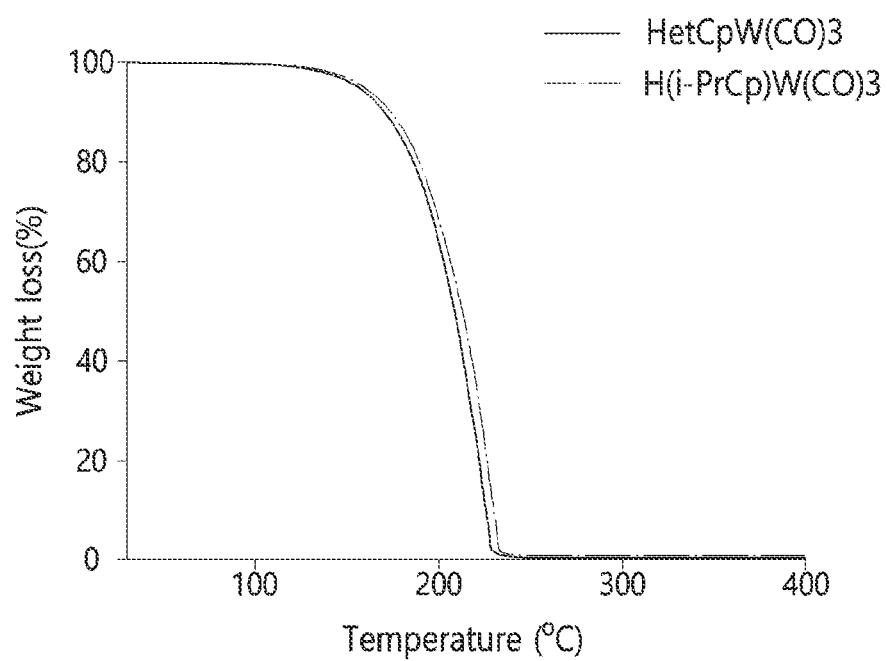
FIG. 2 shows the results of thermogravimetric analysis of organometallic compounds (HEtCpW(CO)$_3$ and Hi-PrCpW(CO)$_3$) produced in Example 3.

As shown in FIG. 2, it could be confirmed that the residual amounts of HEtCpW(CO)$_3$ and Hi-PrCpW(CO)$_3$ at 400'C were 0.21 wt % and 0.94 wt %, respectively.

In addition, the half-lives [T$_{1/2}$(° C.)] of HEtCpW(CO)$_3$ and Hi-PrCpW(CO)$_3$ were measured to be 208° C. and 212° C., respectively.

Fabrication Example

The HEtCpW(CO)$_3$ produced in Example 3 was deposited as a thin film using an atomic layer deposition (ALD) system. The substrate used in this experiment was a wafer having a 300-nm-thick dry oxidation SiO$_2$ deposited on p$^{++}$-type Si. Prior to deposition, the wafer was ultrasonically cleaned sequentially in acetone, ethanol and DI water for 10 minutes each.

Sequentially feeding HEtCpW(CO)$_3$, Ar (16 seconds), hydrogen (H$_2$) and Ar (8 seconds) was set as one cycle. At this time, the feeding time of HEtCpW(CO)$_3$ and the feeding time of hydrogen (H$_2$) were separately controlled. The flow rate of argon (Ar) for purging HEtCpW(CO)$_3$ was set to 50 sccm. Hydrogen (H$_2$) used as a reactant gas (reducing agent) was fed together with argon (Ar) at a flow rate of 157 sccm.

After hydrogen (H$_2$) feeding, plasma (RF power: 200 W, and process pressure: 1.7 torr) was applied to activate the reactant gas.

Each of the reactant gas and the purge gas was fed by controlling the on/off of the pneumatic valve. The deposition temperature was controlled in the range of 100° C. to 400° C., and the reactor pressure was set to 1.7 torr.

In this Fabrication Example, the Si wafer was used as the substrate, but any wafer known in the art, such as a glass, silicon or polymer wafer, may also be used. Although Ar was used as the inert gas, any inert gas known in the art, such as N$_2$ gas, He gas, or a mixed gas thereof, may also be used.

In addition, instead of hydrogen (H$_2$) used as the reactant gas, ammonia (NH$_3$), hydrazine (N$_2$H$_4$), borane (BH$_3$), diborane (B$_2$H$_6$) or the like may also be used as a reducing agent for forming a metal thin film.

Figure 3:
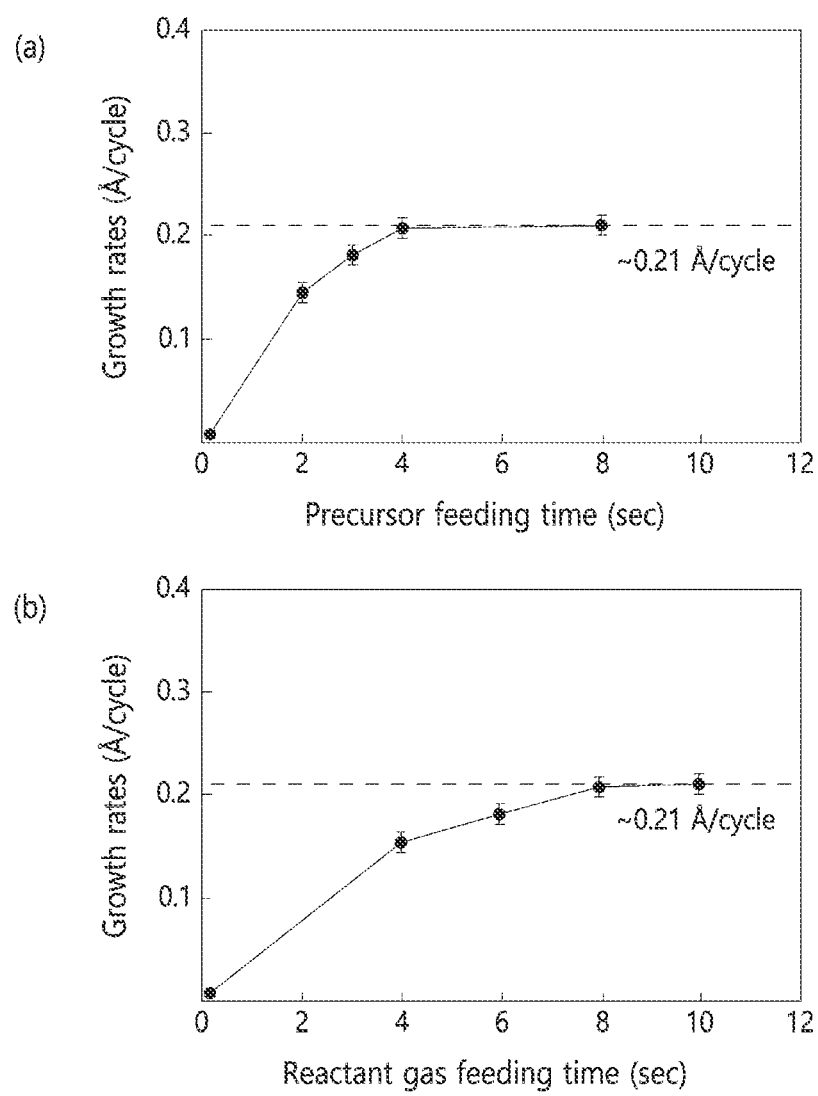
FIG. 3 shows the results of measuring changes in growth rate depending on changes in the feeding times of a precursor and a reactant gas.

[Experimental Example 1] Measurement of Changes in Growth Rate Depending on Changes in Feeding Times of Precursor and Reactant Gas As a result of controlling the feeding time of HEtCpW(CO)$_3$ to each of 2 sec, 3 sec, 4 sec and 8 sec at a deposition temperature of 250° C. in the Fabrication Example, as shown in FIG. 3a, it was confirmed that, as the feeding time increased to 4 sec, the growth rate increased rapidly, but when the feeding time increased from 4 sec to 8 sec, little change in the growth rate was observed. That is, it could be seen that the growth rate was saturated after a feeding time of 4 sec.

In addition, as a result of controlling the feeding time of the reactant gas hydrogen (H$_2$) to each of 4 sec, 6 sec, 8 sec and 10 sec at a deposition temperature of 250° C. as shown in FIG. 3b, it was confirmed that, as the feeding time increased to 8 sec, the growth rate increased rapidly, but when the feeding time increased from 8 sec to 10 sec, little change in the growth rate was observed. That is, it could be seen that the growth rate was saturated after a feeding time of 8 sec.

Figure 4:
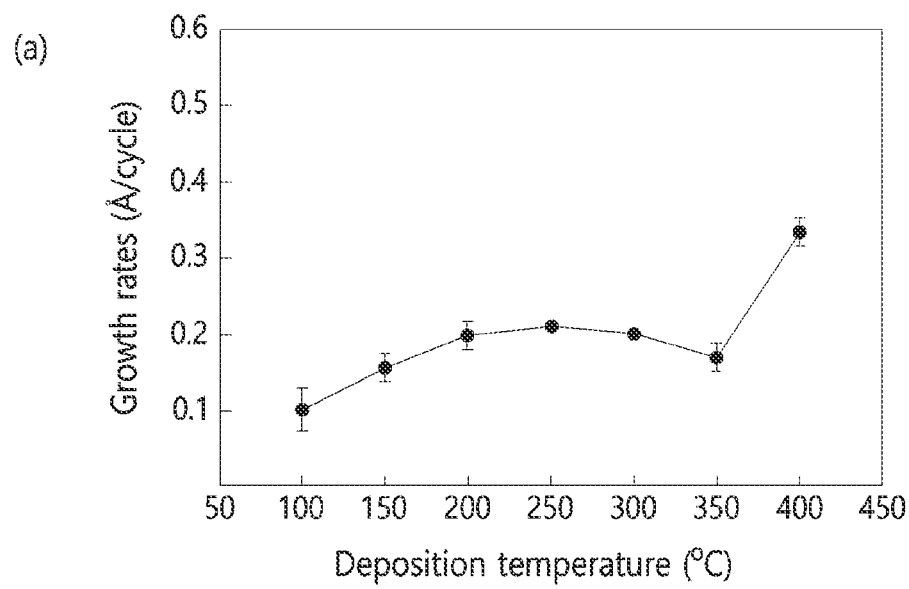
FIG. 4 shows the results of measuring changes in growth rate depending on changes in deposition temperature and measuring changes in thickness depending on the number of ALD cycles.
Figure 4:
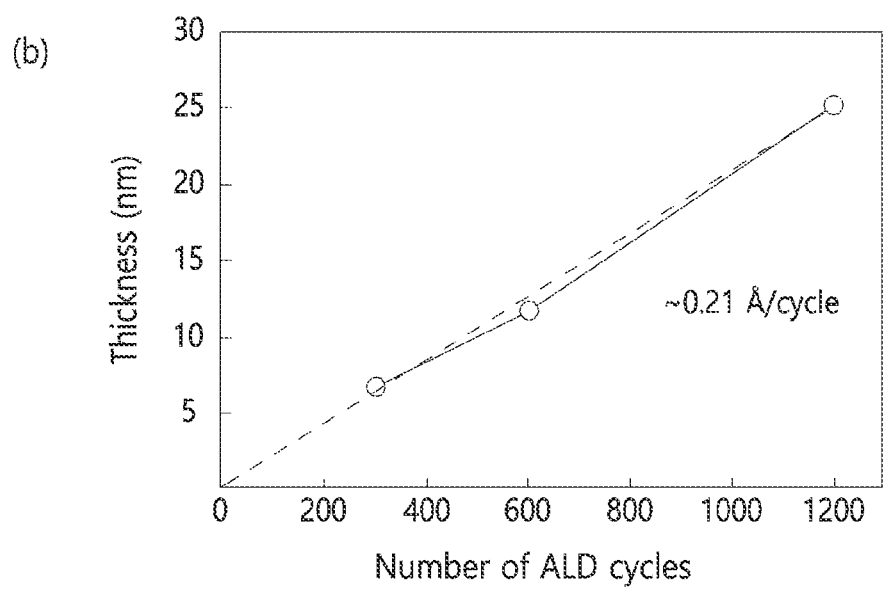

[Experimental Example 2] Measurement of Changes in Growth Rate Depending on Changes in Deposition Temperature and Measurement of Changes in Thickness Depending on Number of ALD Cycles In the Fabrication Example, the deposition temperature was controlled between 100° C. and 400° C. As a result of controlling the deposition temperature, as shown in FIG. 4a, it could be confirmed that a constant growth rate could be ensured at a deposition temperature of 350° C. or below.

That is, as the deposition temperature changed from 100° C. to 200° C., the growth rate increased rapidly, and when the deposition temperature increased from 200° C. to 300° C., the growth rate was kept almost constant. However, when the deposition temperature increased to 350° C., the growth rate tended to decrease slightly. Then, when the deposition temperature increased to 400° C., the growth rate increased again.

In addition, sequentially feeding HEtCpW(CO)$_3$ (4 sec), Ar (16 sec), hydrogen (H$_2$) (8 sec) and Ar (8 sec) was set as one cycle, and the thin film was deposited for each of 300 cycles and 600 cycles at a deposition temperature of 250° C. As a result, as shown in FIG. 4b, it could be confirmed that the thin film was linearly and uniformly deposited without nucleation delay.

[Experimental Example 3] X-Ray Diffraction Analysis of Tungsten Metal Thin Film

Figure 5:
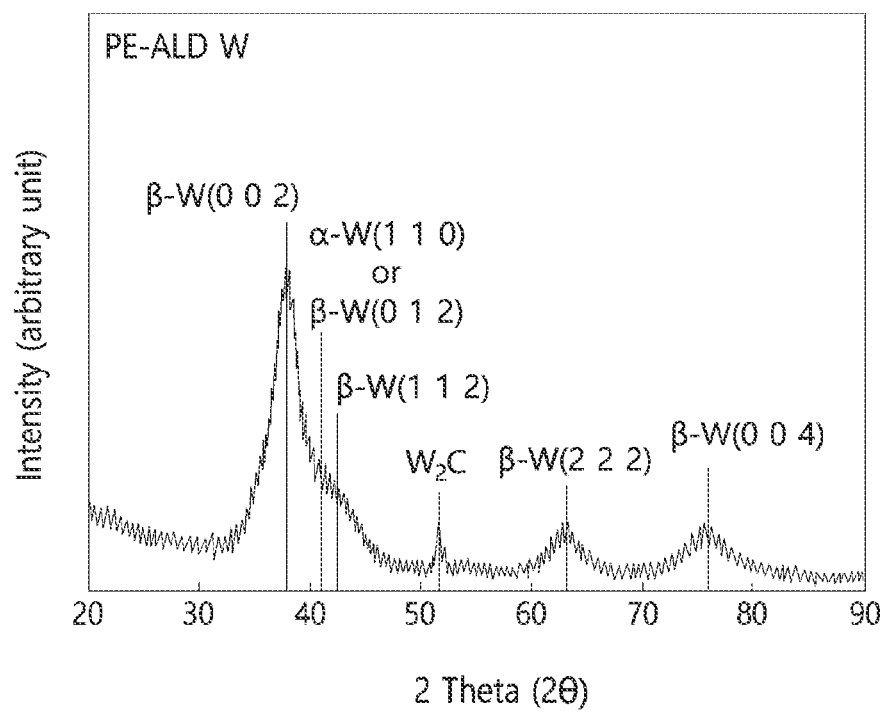
FIG. 5 shows the results of analyzing a fabricated tungsten metal thin film by X-ray diffraction.

As a result of analyzing the fabricated tungsten metal thin film by X-ray diffraction, as shown in FIG. 5, both peaks corresponding to the α-phase and β-phase of tungsten could be observed.

Figure 6:
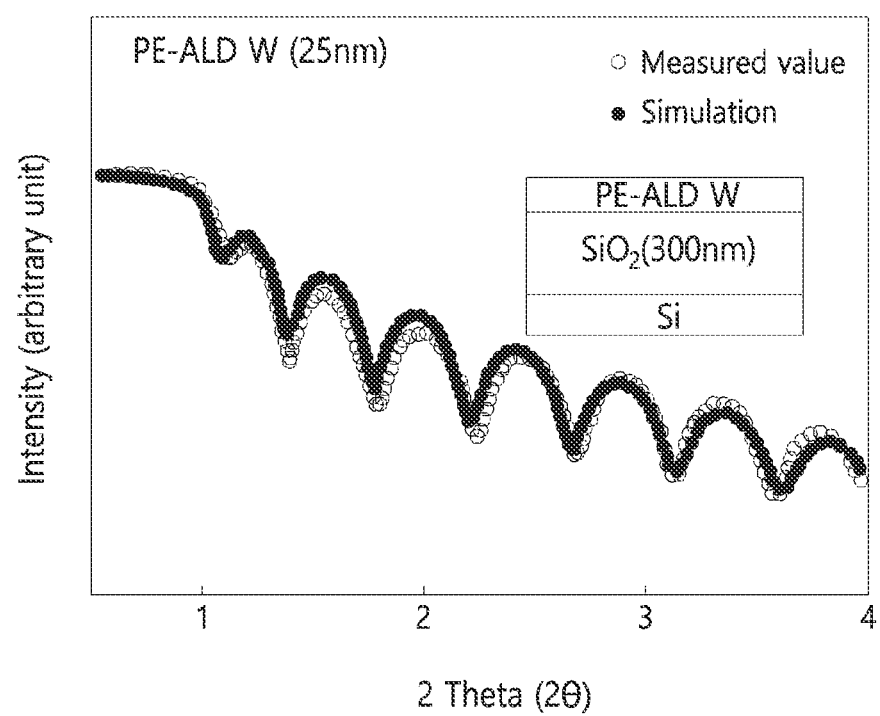
FIG. 6 shows the results of analyzing a fabricated tungsten metal thin film by X-ray reflectometry.

[Experimental Example 4] X-Ray Reflectometry Analysis of Tungsten Metal Thin Film FIG. 6 shows the result of measuring the density of the fabricated tungsten metal thin film by X-ray reflectometry (XRR) and the result of simulation. It could be confirmed that the measurement result and the simulation result were consistent, and the measured density of the thin film was 15.03 g/cm$^3$.

The measured density is higher than the density (10 to 13 g/cm$^3$) of a tungsten metal thin film consisting only of the β-phase. This is believed to be because the α-phase and the β-phase coexist in the fabricated tungsten metal thin film as can be seen from the above-described results of X-ray diffraction analysis.

[Experimental Example 5] Analysis of Specific Resistance Value of Tungsten Metal Thin Film As a result of analyzing the specific resistance value of the tungsten thin film by a 4-point probe method, it could be confirmed that the tungsten thin film had a specific resistance value of 300 μΩ·cm or less.

As described above, the organometallic compound could be synthesized in high yield by the method for producing an organometallic compound according to the present invention.

In addition, as a result of fabricating a metal thin film using the organometallic compound as a vapor deposition precursor, it was confirmed that a thin film having excellent properties was formed.

Due to these excellent properties, the thin film is expected to be utilized in gate electrode and wiring processes in the future, and in addition, this high-quality thin film can be applied to various fields, including nano-device and nano-structure fabrication, semiconductor devices, displays, solar cells, etc.

The scope of the present invention should be defined by the appended claims rather than the above detailed description, and all changes or modifications derived from the meaning and scope of the claims and their equivalent concepts should be interpreted as falling within the scope of the present invention.

What is claimed is:

1. A method for producing an organometallic compound, the method comprising a first step of synthesizing a compound of the following Formula 2 by allowing a metal hexacarbonyl compound to react with a compound of the following Formula 1;
a second step of synthesizing a compound of the following Formula 4 by allowing the compound of Formula 2 to react with a compound of the following Formula 3;
a third step of synthesizing a compound of the following Formula 6 by allowing the compound of Formula 4 to react with a compound of the following Formula 5,

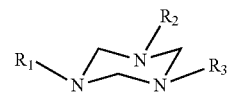

[Formula 1]

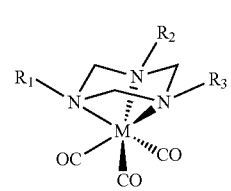

[Formula 2]

[Formula 3]

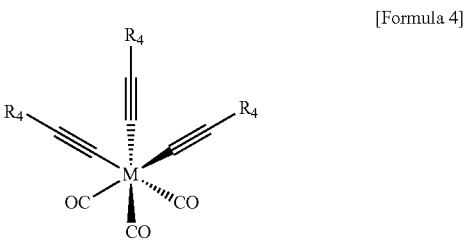

[Formula 4]

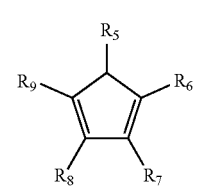

[Formula 5]

wherein
R$_1$ to R$_3$ are each independently hydrogen or a linear or branched hydrocarbon having 1 to 4 carbon atoms, R₄ is hydrogen or a linear or branched hydrocarbon having 1 to 3 carbon atoms, R₅ and R₆ are each independently hydrogen or a linear or branched hydrocarbon having 1 to 4 carbon atoms, R₇ to R₉ are hydrogen, and M is tungsten (W).

2. The method of claim 1, wherein the organometallic compound is a compound of the following Formula 7 or 8:

[Formula 6]

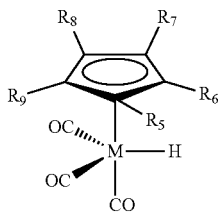

3. A method for fabricating a thin film, the method including steps of:

(1) feeding and depositing a vapor deposition precursor, which comprises an organometallic compound produced by the method of claim 1, onto a substrate, and purging an unreacted portion of the vapor deposition precursor with inert gas; and (2) feeding and allowing a reactant gas to react with the deposited vapor deposition precursor and purging an unreacted portion of the reactant gas, wherein the reactant gas is activated by plasma, a feeding time of the vapor deposition precursor in step (1) is 4 seconds or more, and a feeding time of the reactant gas in step (2) is 8 seconds or more.

4. The method of claim 3, wherein the reactant gas is any one or more selected from the group consisting of an oxidizing agent, a reducing agent, and a nitriding agent.

5. The method of claim 3, wherein the thin film is deposited at a temperature of 350° C. or below and a growth rate of 0.21 Å/cycle or less.

* * * * *